United States Patent [19]
Takahashi et al.

[11] Patent Number: 5,059,794
[45] Date of Patent: Oct. 22, 1991

[54] RADIATION IMAGING SENSOR

[75] Inventors: Tetsuhiko Takahashi, Suginami; Kenichi Okajima, Houya; Ken Ueda, Ome, all of Japan

[73] Assignee: Hitachi, Ltd., Tokyo, Japan

[21] Appl. No.: 517,382

[22] Filed: May 1, 1990

Related U.S. Application Data

[63] Continuation of Ser. No. 181,694, Apr. 14, 1988, abandoned.

[30] Foreign Application Priority Data

Apr. 17, 1987 [JP] Japan ................................ 62-93023
Jul. 8, 1987 [JP] Japan ................................ 62-168654

[51] Int. Cl.$^5$ ............................................. G03B 42/00
[52] U.S. Cl. .................... 250/327.2; 250/484.1
[58] Field of Search .................. 250/213 R, 327.2 R, 250/327.2 E, 484.1

[56] References Cited

U.S. PATENT DOCUMENTS

| 3,010,025 | 11/1961 | Bramley et al. | 250/213 R |
| 3,069,551 | 12/1962 | Haine | 250/213 R |
| 3,484,752 | 12/1969 | Kallmann | 250/327.2 R |
| 4,554,453 | 11/1985 | Feigt et al. | 250/213 R |
| 4,782,227 | 11/1988 | Micheron et al. | 250/327.2 R |

Primary Examiner—Constantine Hannaher
Assistant Examiner—Jacob M. Eisenberg
Attorney, Agent, or Firm—Antonelli, Terry, Stout & Kraus

[57] ABSTRACT

A radiation imaging sensor including laminate structure of a phosphorescent layer, a light-transmissive electrode, a photoconductor layer, an insulating layer and an electrode, an applied voltage to the photoconductor layer through the light-transmissive electrode and the electrode is increased sufficiently so that light emitted from the phosphorescent member causes avalanche multiplicaton of the electrons and/or positive holes generated in the photoconductor layer by field sweep inside the photoconductor layer.

7 Claims, 3 Drawing Sheets

RADIATION IMAGING SENSOR

This application is a continuation of application Ser. No. 181,694, filed on Apr. 14, 1988 now abandoned.

BACKGROUND OF THE INVENTION

1. Field of the Invention

This invention relates generally to a radiation imaging sensor, and more particularly to a radiation imaging sensor having high sensitivity, wide latitude and high spatial resolution.

2. Description of the Prior Art

Computed Radiography apparatuses using a photoconductive material (CR apparatuses) are known in the art and their structure is discussed in SPIE, Vol. 173 (1979), pp. 81–87 and in Japanese Patent Laid-Open No. 228373/1986, for example.

One of the problems with the conventional computed radiography apparatus is that a sufficiently high S/N cannot be obtained. Hereinafter, S/N of a typical sensor will be discussed so as to clarify the problem with the prior art technique.

X-rays absorbed by a phosphorescent material is typically about 50%, though the quantity varies depending on the constituent material and the thickness of the phosphorescent layer. The number of photons L generated at this time is given by:

$$L \text{ (number of photons/pixel)} = N_x \times E/W \times S \times A \quad (1)$$

where $N_x$ is the number of X-ray photons, E is X-ray energy, W is the W value of the phosphorescent material, S is a pixel size and A is an X-ray absorption factor of the phosphorescent material.

It will be hereby assumed that they have the following values, respectively:

$N_x(\text{cm}^{-2}) \sim 4 \times 10^4 R$ ($\mu R$) (R: X-ray dose), $E = 50 \times 10^3$ eV, $W = 15$ eV, $S = (100 \, \mu m)^2 = 10^{-4}$ cm$^2$, $A = 0.5$.

Then, L is given as follows:

$$L = 4 \times 10^4 \times R \times \frac{50 \times 10^3}{15} \times 10^{-4} \times 0.5 \quad (2)$$
$$= 6.7 \times 10^3 \times R \text{(number of photons/pixel)}$$

Assuming that the X-ray dose incident to the sensor is 10 ($\mu R$) < R < 10 (mR), then, the following relation is established from eq. (2):

$$6.7 \times 10^4 < L \text{ (number of photons/pixel)} < 6.7 \times 10^7 \quad (3)$$

In other words, the photoconductive layer must detect such weak light per pixel.

The charge Q obtained by incidence of light is given by the following equation:

$$Q = L \times k \times \eta \times 1.6 \times 10^{-19} \text{ (C)} \quad 4$$

where K is efficiency of incidence of light into the photoconductive layer and $\eta$ is quantum efficiency of photoelectric conversion and $\eta \leq 1.0$ when no propagation exists. If this charge is read out in $\tau$ seconds per pixel, the resulting signal current S is given by:

$$S(A) = Q/\tau \quad 5$$

Assuming that $k = 1.0$, $\eta = 1.0$ and hence $\tau = 1 \times 10^{-5} S$, then the signal quantity S for L of eq. (3) becomes a weak current as expressed by the relation below:

$$1.1 \times 10^{-9} < S(A) < 1.1 \times 10^{-6} \quad 6$$

Therefore, signal detection is extremely difficult. Furthermore, since the absolute value of its signal component is small, S/N drops at the time of signal detection, so that picture quality deteriorates in the image having a small radiation dose.

On the other hand, the increase in optical detection sensitivity has been reported by avalanche multiplication inside a blocking type photoconductive film as a result of studies of imaging tubes (ITEJ Technical Report, Vol. 10, No. 45, p.p. 1–6, 1987). However, this technique cannot be utilized as such for radiation measurement because the stopping power of the photo-conductive film for X-rays is low. If the thickness of the photoconductive film is merely increased in order to improve X-ray stopping power, problems develop such that stable propagation cannot be made and spatial resolution drops during the propagation process.

SUMMARY OF THE INVENTION

It is therefore an object of the present invention to provide an apparatus which amplifies a weak signal by X-rays described above before noise mixes with it, obtaining eventually an electrical signal having high S/N and thus a high quality X-ray image even at a low dose.

It is another object of the present invention to provide a radiation imaging apparatus which does not include a mechanical moving portion for reading out an X-ray image and which therefore makes it possible to read out the X-ray image at a high readout speed and to reduce the size and production cost of the apparatus.

It is still another object of the present invention to provide a radiation imaging apparatus which can easily change the readout time as well as the quality of the detected image.

In a radiation imaging apparatus including a laminate structure consisting of a phosphorescent layer, a first light-transmissive electrode, a photoconductor layer, an insulating layer and a second light-transmissive electrode, the objects of the invention described above can be accomplished by the arrangement wherein a voltage to be applied across the first and second electrodes is increased to a sufficiently high level and the photons emitted from the phosphorescent material causes avalanche multiplication of the electrons and/or positive holes generated inside the photo-conductor layer by field sweep inside the photoconductor layer.

More definitely, in the radiation imaging apparatus in accordance with the present invention, at least one of the first and second electrodes, the photoconductor layer being interposed between them, is formed by dividing it into electrode elements in the form of a unidimensional array and means for exciting the photoconductor includes a unidimensional array-like light emitting element laminated on the laminate structure including the photoconductor and divided in a direction crossing the direction of division of the electrode, read means capable of selectively reading out the signal of each of the unidimensional array-like electrode elements and switching means for selectively letting each of the unidimensional array-like light emitting elements emit the light.

According to the construction described above, a read position in the unidimensional direction can be determined by sequential selection by the read means and a read position in another unidimensional direction crossing the unidimensional direction described above can be determined by sequential selection by the switching means and they can be scanned at a high speed without the necessity of mechanical driving. Furthermore, among the unidimensional array-like electrodes, a plurality of them are connected in common as a group and each of these commonly connected groups can be sequentially read out. Similarly, a plurality of light emitting elements are put together as a group so that each of these groups emits light simultaneously in a scanning mode and it is thus possible to change a scanning mode in which the scanning period can be shortened with a reduced number of pixels.

DESCRIPTION OF THE PREFERRED EMBODIMENTS

Figure 1:
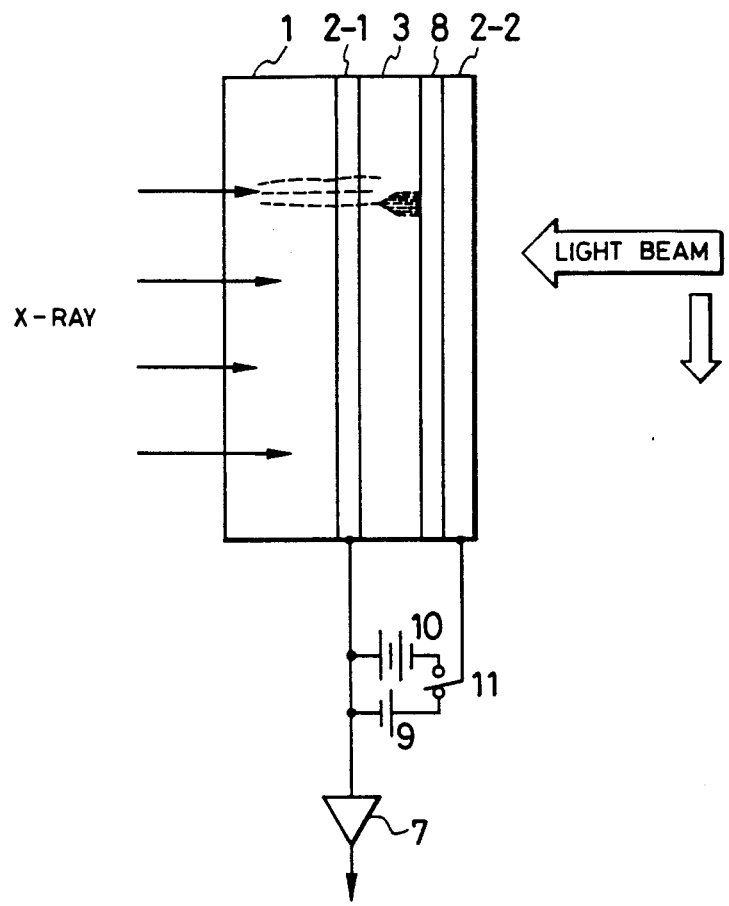
FIG. 1 is a sectional view showing one embodiment of the present invention.

Hereinafter, a first embodiment of the present invention will be explained with reference to FIG. 1. First of all, the structure of this embodiment will be described. A phosphorescent member 1 consists of a 300 μm-thick BaFBr phosphorescent member. Two transparent electrodes 2-1 and 2-2 each consists of 0.1 μm-thick SnO$_2$ and interposed between them is an insulating layer 8 and a photoconductor layer 3. The photoconductor layer 3 consists of 2 μm-thick amorphous Se. The insulating layer 8 may consist of a porous layer of Sb$_2$S$_3$, for example.

The voltage to be impressed between the transparent electrodes can be changed by a switch 11. In other words, two power supplies 9 and 10 having mutually opposite polarities and different absolute voltages are selected. A signal current is led to a detection circuit through an amplifier 7.

The principle of operation of the charge storage type sensor such as shown in FIG. 1 consists of three stages, i.e. initial charge, discharge due to incidence of an optical signal and re-charge and detection of a current flowing at the time of re-charge. Let's consider S/N of the detection signal of one pixel in this process. The signal S and fluctuation S can be expressed as follows:

$$S \pm \Delta S = (C \pm \Delta C) - (C' \pm \Delta C') + (L \pm \Delta L) \qquad 6$$

where C: initial charge quantity,
C': charge quantity at the time of re-charge
L: discharge quantity due to incidence of optical signal.

Here, noise ΔS is given as follows:

$$\Delta S^2 = \Delta C^2 + \Delta C'^2 + \Delta L^2 \qquad 7$$

Next, S/N is given as follows while taking $C \sim C'$ and $\Delta C \sim \Delta C'$ into consideration:

$$S/N = \frac{L}{\sqrt{2\Delta C^2 + \Delta L^2}} \qquad (8)$$

Next, let's consider L and ΔL. The optical signal quantity L can be approximated as follows:

$$L \sim \begin{cases} KX\eta & : (KX\eta << C) \\ C & : (KX\eta >> C) \end{cases} \qquad \begin{matrix}(9)\\10\end{matrix}$$

where $$KX\eta = X \cdot \frac{E}{W} \cdot k \cdot \eta \cdot e \qquad 11$$

X: X-ray particle number,
E: X-ray energy,
W: W-value of phosphorescent material
k: incidence efficiency of light from phosphorescent member into photoconductor, $$K = \frac{E}{W} \cdot k \cdot e;$$

photo-conversion efficiency,
η: quantum efficiency of photoelectric conversion,
e: elementary quantity.

Since K >> 1 generally and since η >> 1 in the present invention, ΔL can be written as follows:

$$\Delta L \sim \begin{cases} \Delta XK\eta = K\eta\sqrt{X} & : (KX\eta << C) \\ \Delta C & : (KX\eta >> C) \end{cases} \qquad \begin{matrix}12\\13\end{matrix}$$

In other words, the fluctuation of the optical signal results from the X-ray quantum noise.

Next, let's consider C and ΔC.

$$C = eN, \; \Delta C = e\sqrt{N} \qquad 14$$

Here, e: elementary quantity,
N: electron number under charged state.
S/N is given as follows from eq. (8) to (14):

$$S/N = \frac{KX\eta}{\sqrt{2e^2N + \Delta L^2}}$$

$$\begin{cases} \sim \dfrac{KX\eta}{\sqrt{2eC + \eta^2K^2X}} \sim \dfrac{KX\eta}{\sqrt{2eC}} & :(\eta KX << 2eC) \qquad 15 \\ \sim \dfrac{C}{\sqrt{2eC + 2eC}} = \sqrt{\dfrac{C}{4e}} & :(\eta KX >> C) \qquad (16) \end{cases}$$

Figure 2:
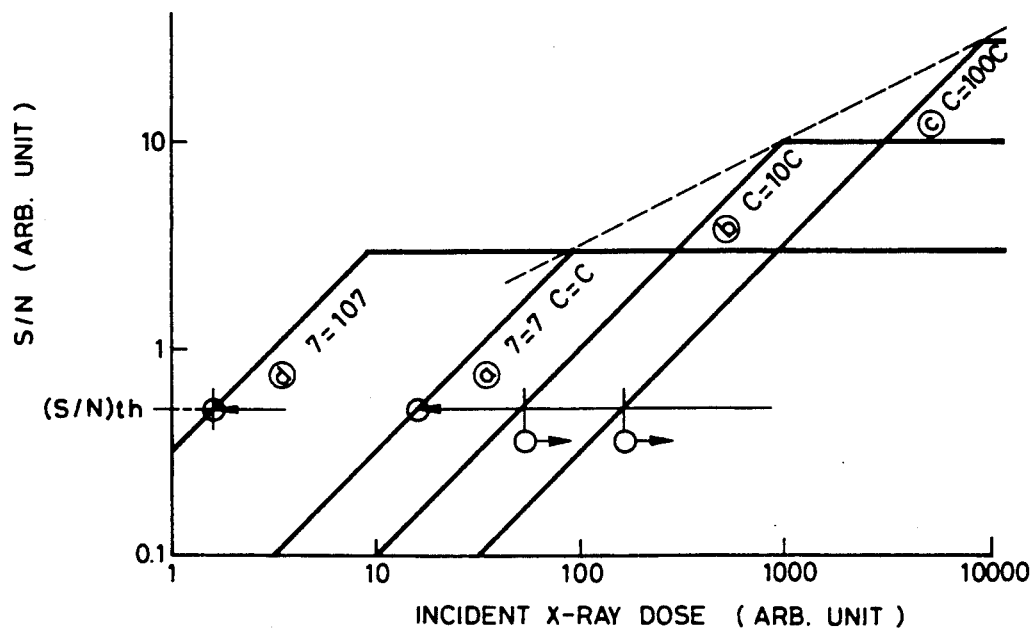
FIGS. 2 and 3 are diagrams showing the effect of the present invention.

Here, approximation of eq. (15) and (16) corresponds to the consideration of S/N resulting from the sensor. Equation (15), (16) is schematically shown in FIG. 2. The incident X-ray dose is plotted on the abscissa and S/N of the signal is plotted on the ordinate. Line (a) represents eq. (15) and (16). It can be understood from this diagram that S/N drops with S/N ∝ X at a low radiation dose while S/N remains constant at a high radiation dose. If C is increased 10 times and 100 times while keeping η constant, the results are represented by lines (b) and (c), respectively. Though S/N in a high dose range can be improved, it drops in a low dose range, on the contrary. As a result, the X-ray dose to secure necessary S/N=(S/N)$_{th}$ becomes rather greater. In other words, there has, conventionally, existed a limit for reducing the dose. If C is decreased, S/N drops in the entire range and the quality of the image drops. Moreover, even the necessary S/N cannot be obtained. If $\eta$ is increased ten times, on the other hand, the result is represented by line (d) and S/N is improved drastically in the low dose range. S/N in the high dose range does not drop, either, and the quality of the image can be remarkably improved as a whole. It can thus be understood that optical propagation in the photoconductor layer contributes greatly to the improvement in the image quality in the low dose range.

It is obvious that the increase of both $\eta$ and C is extremely effective.

Turning back again to eq. (15), it can be understood that the increase in $\eta$ and the increase in $\kappa$ exhibit the similar effect. However, since $\kappa$ has a value above 50% of the theoretical limit at present, it cannot be increased drastically, whereas $\eta$ can be increased easily by ten times because the phenomenon of avalanche multiplication which brings propagation of a number of carriers in geometrical progression is utilized and there is no theoretical limit.

In this manner, the increase in $\eta$ is extremely effective for improving the performance of photoconduction type radiation sensors.

Since it is necessary for the photoconductor film to merely absorb light, the film thickness need not be increased remarkably. As a result, the film thickness can be set to a thickness most suitable for optical propagation. Accordingly, optical propagation can be carried out stably and spatial resolution does not get deteriorated during the propagation.

Next, the operation of the embodiment shown in FIG. 1 to accomplish the effect described above will be explained.

First of all, the ray of light is radiated while a 150V voltage is being applied between the electrodes by use of the power supply 9. As a result, electrons and positive holes are induced on the surface of the insulating layer. Electron propagation does not occur at this time because the voltage between the electrodes is low.

Next, the voltage between the electrodes is held at 240V by changing the power supply from 9 to 10 by the switch 11. The X-rays are radiated under this state. The X-rays are converted to light by the phosphorescent member 1, absorbed by the photoconductor layer and generates the electron/positive hole pairs. The electron/positive hole pairs cause avalanche multiplication while being swept in mutually opposite directions by the strong field generated by the electrode 2. Finally, the positive holes reach the surface of the insulating layer and the charge that has previously been induced decreases due to recombination. In this manner, the image information is formed as propagated charge patterns on the insulating layer surface.

Then, the voltage between the electrodes is set to 150V by the switch. Charging in accordance with the discharge quantity is made by scanning the photo-conductor layer by the rays of light contracted to a necessary pixel size such as a He-Ne laser beam of 100 $\mu\phi$. The inflowing current developing at this time is detected by use of the amplifier 7.

Next, an example of photoelectron propagation will be illustrated.

Figure 3:
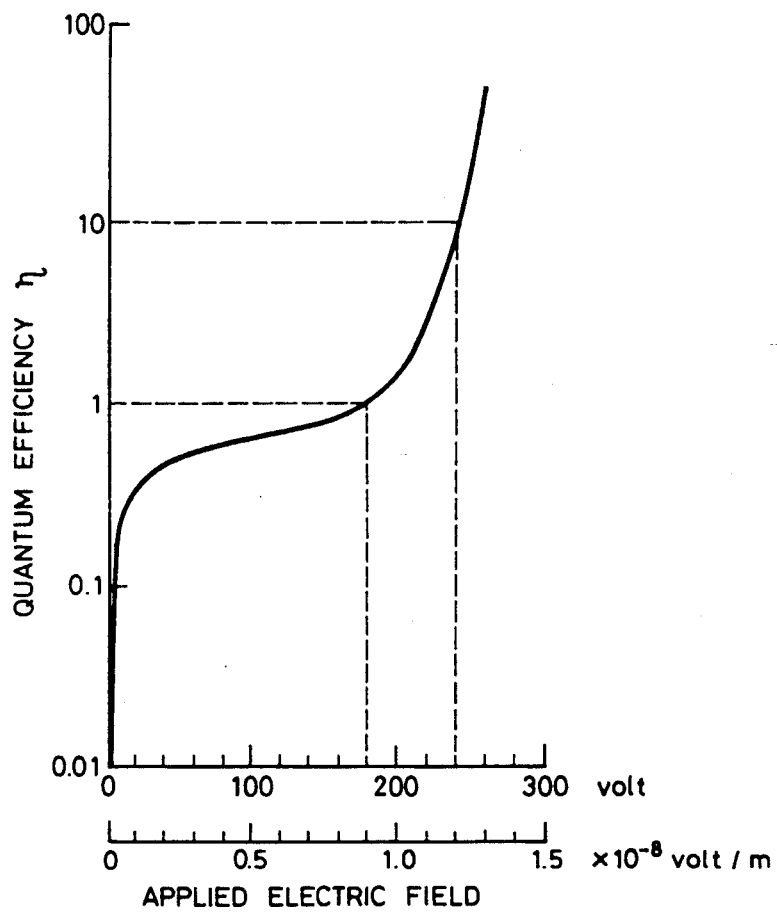

FIG. 3 shows the relationship between the impressed voltage of the blocking type photoconductor film and the quantum efficiency of photoelectric conversion $\eta$. It can be understood from this diagram that no propagation occurs below the applied voltage of 180V, that is $\eta<1$, but $\eta$ increases drastically above 180V and $\eta \sim 10$ at 240V. When the applied voltage is further increased, $\eta$ becomes greater and greater and high sensitivity X-ray imaging detection is made but a dark current or in other words, the output current when no X-rays are incident, becomes great and the signal-to-noise ratio (S/N) of the image drops. Therefore, there is a practical upper limit to the applied voltage. In the case of this embodiment, the range of the applied voltage is preferably from 180V to 300V. Since the photoconductor layer is 2 $\mu$m thick in this embodiment, the field intensity between the electrodes is preferably from $0.9 \times 10^8$ to $1.5 \times 10^8$ V/m. It has been confirmed that so long as amorphous Se is used at the photoconductor film, the preferred range of the field intensity between the electrodes does not change irrespective of the film thickness.

Figure 4:
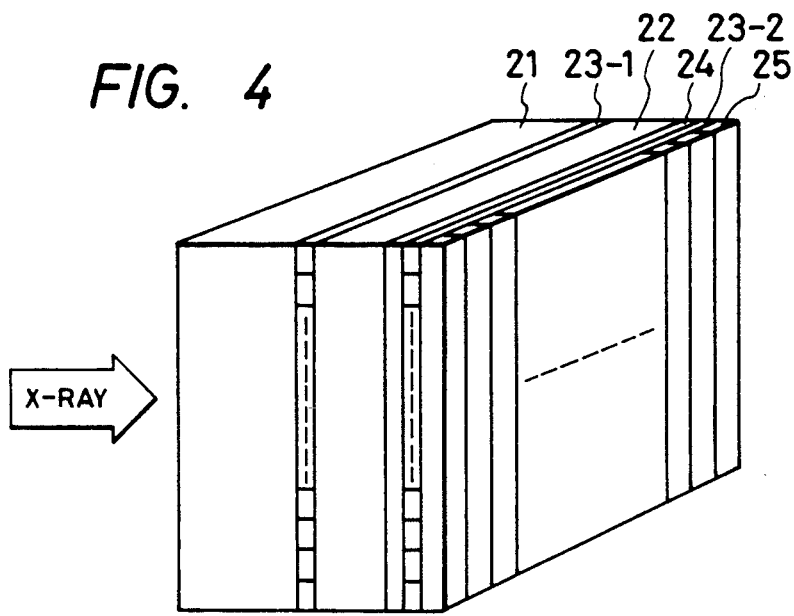
FIGS. 4 and 5 are a perspective view and block diagram of another embodiment of the present invention.

Next, another embodiment of the invention wherein the structure of the excitation portion for read-out is different will be described with reference to FIG. 4.

The phosphorescent member 21 consists of 300 $\mu$m-thick BaFCl phosphor or CdWO$_4$ Scintillator, for example. The photoconductor layer 22 consists of 2 $\mu$m-thick amorphous Se or amorphous Si, for example. This corresponds to a storage portion of X-ray imaging. A pair of transparent electrodes 23-1, 23-2 that interpose the photoconductor layer 22 between them consist of 0.1 $\mu$m-thick SnO$_2$ or ITO. The electrode group is divided in a unidimensional direction and the width of one element is 100 $\mu$m, for example, and the number of elements is 1,000, for example. The electrode group corresponds to the read-out portion described above. An insulating layer 24 is inserted between the electrode group 23-2 and the photoconductor layer 22. Sb$_2$S$_3$ or an organic insulating thin film is used as the insulating layer 24, for example. The thickness of the insulating layer 24 may be selected arbitrarily and is, for example, 0.1 $\mu$m. Furthermore, a stripe-like light emitting member line 25 is prepared as the excitation portion. The width of one element is, for example, 100 $\mu$m and the number of elements is, for example, 1,000. Their dividing direction crosses the electrode group at right angles. An EL light emitting member or a surface light emitting LED is used as the light emitting member.

Since the read-out portion and the excitation portion are divided, the imaging sensor has the size of 10 cm in both the longitudinal and transverse directions and spatial resolution of 5 lp/mm.

Next, the principle of operation will be described.

First of all, a voltage V is applied to all the elements of the electrode 23 and all the elements of the light emitting member 25 are driven to emit the light. Accordingly, charge is induced on the interface defined by the photoconductor layer 22 and the insulating layer 24.

Next, the light emitting members are turned off to terminate stimulation and then a voltage $-V'$ having the opposite polarity to the electric field described above is applied to all the elements of the electrode 23. The X-ray image is allowed to be incident into the phosphorescent layer 2 under this state. This image is converted to an optical image by the phosphorescent layer 2 and this optical image passes through the transparent electrode 23 and is incident into the photoconductor layer. The charge that has been induced previously is discharged in accordance with the incident light quantity at this time. As a result, a charge pattern reflecting the incident X-ray image is formed between the photoconductor layer and the insulating layer. This is the stored image. After the X-ray radiation is complete, the stored image is read out. The polarity of the voltage between the electrodes is again reversed and the voltage V set initially is applied to all the electrodes. Under this state, the first channel of the light emitting member 25 is caused to emit light. The charge inflowing into the photoconductor layer 22 from each electrode 23 at this time is equal to the charge quantity discharged from the previous incident light in a very small area (1 pixel) where each electrode and the first channel of the light emitting member cross and therefore reflects the image information at the light emitting position. This inflowing current is detected for each element of the electrode 23. Light emission of the light emitting member is made sequentially for each light emitting element of the light emitting member and when the read operation is made in the same way as described above, the entire image information can be obtained.

In this embodiment, storage of the X-ray image is made in the photoconductor layer after the X-ray image is once converted to the optical image. However, the X-rays may be stored directly by making the photoconductor layer sufficiently thick (e.g. 500 μm).

Each constituent unit in the embodiment described above is not particularly limitative so long as it exhibits its expected function.

For instance, though this embodiment utilizes the photoconductor electrode material for the storage portion, the material may be those which can store the X-ray image, and a laser stimulable phosphor material can be used for the storage portion, for example. The sensor structure at this time is described in Japanese laid-open patent application No. 62-69182.

Figure 5:
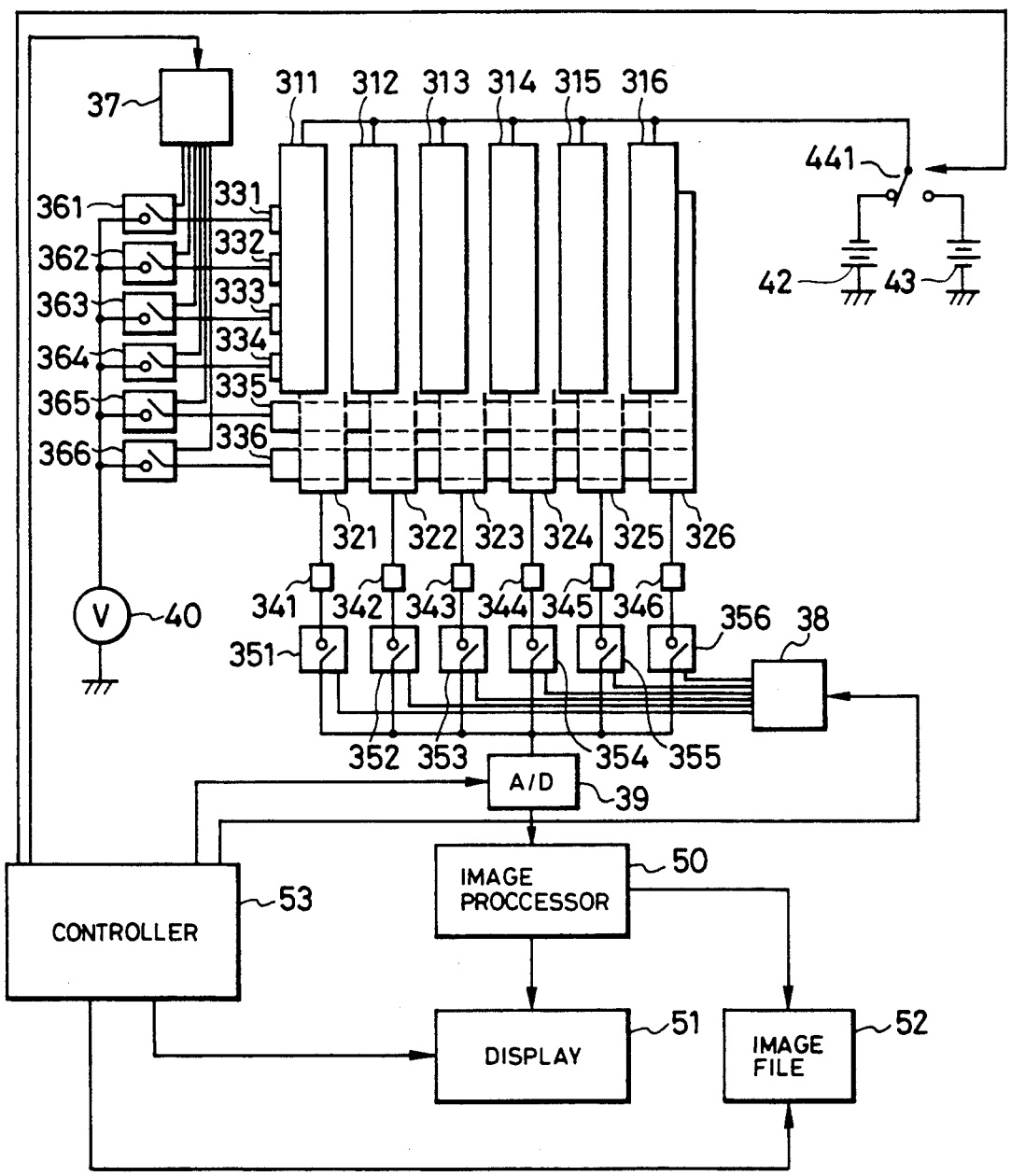

The overall structure of the embodiment using the sensor shown in FIG. 4 will be described in further detail with reference to FIG. 5. The drawing shows the case where each of the excitation portion and the readout portion has 6 channels and the total pixel number is 36 for simplification. A photoconductor material is assumed as the material of the storage portion and the basic structure may be the same as one shown in FIG. 4, for example. However, the storage portion is omitted from FIG. 5 to simplify the illustration.

A positive or negative voltage is applied by a power supply 42 or 43 to the electrodes 311–316. The power supplies are selected by a switch 441. The electrodes 321–326 form pairs with the electrodes 311–316, respectively. The output signal from each electrode is integrated and held by each integrator 341–346. The integrated signal is sequentially subjected to A/D conversion and signal processing by an A/D convertor 39 through a switch 351 which is opened and closed by an address designation unit 38.

Light emitting portions 331–336 each consist of an EL light emitting member, for example, and its ON/OFF is made by a switch 361–366 which is opened and closed by an address designation unit 37. A power supply 40 is provided in order to cause EL light emission. The address designation unit 37, 38, A/D convertor 39 and switch 441 are controlled by a controller 53. After A/D conversion, the signal is subjected to various processings by an image processor, is displayed on a display 51 and is stored in an image file 52.

This embodiment has the following two operation modes.

Mode 1: Low Speed High Spatial Resolution Mode

When the light emission portion address designation unit 37 designates an address 1, the switch 361 is closed to actuate the light emitting member 331 and the storage portion is stimulated. The read signal generated at this time is stored in each integrator 341–346 and the readout portion address 38 sequentially opens and closes the switches 351→356, thereby obtaining image signals (f (pixel address)). In other words, f(1, 1), f(1, 2), ..., f(1, 6) are read. Next, the similar operation is carried out by designating the light emission portion address 2 to read $$f(2, 1), f(2, 2), \ldots, f(2, 6).$$

These procedures are repeated till the light emission portion address 6 to obtain the image data of 36 pixels:

$$f(1, 1)-f(1, 6)$$

$$f(6, 1)-f(6, 6)$$

The read time at this time is 6 xt with t representing one stimulation time.

Mode 2: High Speed Low Spatial Resolution Mode

The operation method is as follows.

The switches 361 and 362 are closed by the light emission portion address designation unit 37 so as to let the light emitting members 331 and 332 emit light simultaneously. The signals generated at this time are stored in the integrators 341–346 and the image signals f(1 & 2, 1), f(1 & 2, 2), ..., f (1 & 2, 6) are read. Here, (1 & 2) means the small portion on the image surface defined by the light emitting portion address 1 and 2. After each signal is subjected to A/D conversion, data addition is made in the following manner:

$$f(1 \& 2, 1 \& 2) = f(1 \& 2, 1) + f(1 \& 2, 2)$$
$$f(1 \& 2, 3 \& 4) = f(1 \& 2, 3) + f(1 \& 2, 4)$$
$$\vdots$$

Next, the light emitting portions 363 and 364 are caused to emit light simultaneously by designating the light emitting portion addresses 3 and 4 and the same operation as described above is carried out. The same operation is also made for the light emitting portions 365 and 366. In this manner, the image information of nine pixels are read as listed below:

$$f(1 \& 2, 1 \& 2) - f(1 \& 2, 5 \& 6)$$
$$\vdots \qquad \qquad \vdots$$
$$f(5 \& 6, 1 \& 2) - f(5 \& 6, 5 \& 6)$$

Spatial resolution at this time drops by ½ when compared with the Mode 1. On the other hand, the read time is 3 xt with t representing the same meaning as above and the read speed can be doubled when compared with the Mode 1.

In the embodiments described above, coupling of channels of the read-out portion is made digitally after A/D conversion but addition may be made analog-wise before A/D conversion.

Since the channel number as well as channel coupling number can be selected suitably, those shown in the embodiment are not particularly limitative.

Furthermore, even when only one of the electrodes interposing the photoconductor is divided into the unidimensional array form with the other being kept as a uniform electrode, the selective read operation and the change of the read modes can be made in the same way as described above.

What is claimed is:

1. A radiation imaging sensor comprising:
    a phosphorescent layer for converting a radiation image to a visible ray image;
    a laminate structure, optically connected to said phosphorescent layer, and including a first light-transmissive electrode, a photoconductor layer, an insulating layer and a second light-transmissive electrode, wherein said photoconductor layer is a blocking type layer;
    means for applying a storing voltage between said first and second light-transmissive electrodes so that said radiation image is stored in said laminate structure as an electric charge distribution, said storing voltage being of such magnitude that avalanche multiplication of at least one of electrons and holes takes place in said photoconductor layer when an electron and hole pair, which is generated in said photoconductor layer by absorption of a photon emitted from said phosphorescent layer, move toward respective surfaces of said photoconductor layer; and
    means for reading out said radiation image from said laminate structure, by scanning said photoconductor layer with a light beam under the condition that a reading voltage is applied between said first and second light-transmissive electrodes.

2. A radiation imaging sensor according to claim 1, wherein said photoconductor layer is made of amorphous Se and the field intensity produced by the storing voltage applied between said first and second light transmissive electrodes is from $0.9 \times 10^8$ to $1.5 \times 10^8$ (volt/m).

3. A radiation imaging sensor according to claim 1, wherein one of said first and second electrodes is divided into unidimensional array-like electrode groups, and said laminate structure includes further a unidimensional array-like light emitting element group divided in a direction crossing the dividing direction of said one electrode at right angles.

4. A radiation imaging sensor comprising a laminate structure including:
    a phosphorescent member for converting a radiation image to a visible ray image;
    a storage layer for storing said visible ray image as a latent image;
    first and second electrodes facing each other while interposing said storage layer therebetween, at least one of said electrodes being divided in a unidimensional array form; and
    a unidimensional array-like light emitting element group for stimulating said storage layer by light, being divided in a direction crossing the dividing direction of said electrode; said radiation imaging sensor further including:
    switch means for sequentially and selectively causing said light emitting element group to emit light; and
    read means for sequentially and selectively reading out a signal from each of said unidimensional array-like electrodes.

5. A radiation imaging sensor according to claim 4, which further includes means for changing the selection mode of said light emitting elements by said switch means and the selective read mode of said signal by said read means.

6. A radiation imaging sensor comprising:
    a phosphorescent layer for converting a radiation image to a visible ray image;
    a laminate structure, optically connected to said phosphorescent layer, and including a first light-transmissive electrode, a photoconductor layer, an insulating layer and a second light-transmissive electrode, wherein said photoconductor layer is a blocking type layer;
    means for charging said laminate structure before storing said radiation image by applying a first voltage between said first and second light-transmissive electrodes;
    means for applying a second voltage, reverse in polarity to said first voltage, between said first and second light-transmissive electrodes so that said radiation image is stored in said laminate structure as an electric charge distribution, the second voltage being of such magnitude that avalanche multiplication of at least one of electrons and holes takes place in said photoconductor layer when an electron and hole pair, which is generated in said photoconductor layer by absorption of a photon emitted from said phosphorescent layer, move toward respective surfaces of said photoconductor layer; and
    means for reading out said radiation image from said laminate structure by scanning said photoconductor layer with a light beam under the condition that said first voltage is applied between said first and second light-transmissive electrodes.

7. A radiation imaging sensor according to claim 6, wherein one of said first and second electrodes is divided into unidimensional array-like electrode groups, and said laminate structure further includes a unidimensional array-like light emitting element group divided in a direction crossing the dividing direction of said one electrode at right angles.

* * * * *